(12) United States Patent
Imamura et al.

(10) Patent No.: US 8,587,313 B2
(45) Date of Patent: Nov. 19, 2013

(54) GRADIENT MAGNETIC FIELD COIL DEVICE AND MAGNETIC RESONANCE IMAGING APPARATUS

(75) Inventors: Yukinobu Imamura, Hitachi (JP); Mitsushi Abe, Hitachinaka (JP); Masanao Terada, Tokai (JP); Akira Kurome, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 512 days.

(21) Appl. No.: 12/866,327

(22) PCT Filed: Jan. 29, 2009

(86) PCT No.: PCT/JP2009/051503
§ 371 (c)(1), (2), (4) Date: Aug. 5, 2010

(87) PCT Pub. No.: WO2009/099001
PCT Pub. Date: Aug. 13, 2009

(65) Prior Publication Data
US 2010/0321019 A1 Dec. 23, 2010

(30) Foreign Application Priority Data
Feb. 5, 2008 (JP) ................................. 2008-024805

(51) Int. Cl.
*G01V 3/00* (2006.01)

(52) U.S. Cl.
USPC .......................................................... 324/318

(58) Field of Classification Search
USPC ................................ 324/300–322
See application file for complete search history.

(56) References Cited

U.S. PATENT DOCUMENTS

| | | | |
|---|---|---|---|
| 5,177,442 A | * | 1/1993 | Roemer ........................ 324/318 |
| 5,289,128 A | * | 2/1994 | DeMeester et al. ........... 324/318 |
| 5,424,643 A | * | 6/1995 | Morich et al. ................ 324/318 |
| 5,488,299 A | | 1/1996 | Kondo et al. |
| 5,642,049 A | | 6/1997 | Harada et al. |
| 5,804,968 A | | 9/1998 | Richard et al. |
| 6,311,389 B1 | | 11/2001 | Uosaki et al. |

FOREIGN PATENT DOCUMENTS

| | | |
|---|---|---|
| JP | 6-38942 A | 2/1994 |
| JP | 7-303624 A | 11/1995 |

(Continued)

OTHER PUBLICATIONS

Japanese Office Action received in JP2008-024805 issued Jan. 8, 2013.

*Primary Examiner* — Melissa Koval
*Assistant Examiner* — Daniel Miller
(74) *Attorney, Agent, or Firm* — Mattingly & Malur, PC

(57) ABSTRACT

When the gradient magnetic field 9 is generated, a low magnetic field region 22 and a high magnetic field region 21 are generated where a magnetic field crossing at least one of the first forward coil 11a, a second forward coil 11b, first revere coil 11e, and a second reverse coil 11d has different intensities between the low and high magnetic field regions and the intensity in the high magnetic region is higher than the intensity in the low magnetic field region. A line width Dlh of the coil line in the high magnetic field region 21 is narrower than the line width Dll of the coil line 24 in the low magnetic field region 22. There is provided a gradient magnetic field coil can suppress in a usable range heat generations due to eddy current and due to a pulse large current which steeply varies.

9 Claims, 7 Drawing Sheets

(56) References Cited

FOREIGN PATENT DOCUMENTS

| | | |
|---|---|---|
| JP | 07-313490 A | 12/1995 |
| JP | 9-50909 A | 2/1997 |
| JP | 10-216102 A | 8/1998 |
| JP | 2000-82627 A | 3/2000 |
| JP | 2001-149334 A | 6/2001 |

* cited by examiner y-AXIS GRADIENT MAGNETIC FIELD MAIN COIL LAYER y-AXIS GRADIENT MAGNETIC FIELD SHIELD COIL LAYER x-AXIS GRADIENT MAGNETIC FIELD MAIN COIL LAYER

GRADIENT MAGNETIC FIELD COIL DEVICE AND MAGNETIC RESONANCE IMAGING APPARATUS

TECHNICAL FIELD

The present invention relates to a gradient magnetic field coil device for generating a gradient magnetic field and a magnetic resonance imaging apparatus (hereinafter referred to as MRI) using the gradient magnetic field coil device.

BACKGROUND ART

An MRI apparatus provides a tomographic image indicating physical and chemical characteristics using a magnetic nuclear resonance phenomenon generated by irradiating high frequency pulses to an inspection object placed in a uniform static magnetic field and is particularly used for medical applications. The MRI apparatus mainly includes a static magnetic field coil device for generating a uniform static magnetic field in an imaging region into which the inspection object is inserted, a gradient magnetic field coil device for generating a gradient magnetic filed of which magnetic intensity spatially varies to have a gradient to apply positional information to the imaging region, an RF coil for irradiating high frequency pluses to the inspection object, a receiving coil for receiving a magnetic resonance signal from the inspection object, and a computer system for processing the received magnetic resonance signal to display the tomographic image.

To improve the MRI apparatus, increase in a magnetic field intensity of the gradient magnetic field and a high speed pulse driving for the gradient magnetic field are considered. These, contributing to shortening an imaging time and improvement in image quality of the tomographic image, are frequently used in a high speed imaging method. This is because an improvement in performance of a driving power supply for the gradient magnetic field coil device allows a high speed switching and a large quantity of current to flow therethrough.

However, the large quantity of pulse current, i.e., a large current having steep variations in waveform, flowing through the device causes eddy current in the gradient magnetic field device. A heat generated at the gradient magnetic field device due to the eddy current increases temperatures thereof and in the vicinity of the gradient magnetic field device. The eddy current, generating an unnecessary magnetic field in the imaging region, decreases an accuracy in gradient of the gradient magnetic field.

JP 10-216102 discloses, in FIG. 6, a method of suppressing generation of the eddy current by using a plurality of thin lines as lead lines connected to the gradient magnetic field device.

DISCLOSURE OF THE INVENTION

Problems to be Solved by the Invention

A market of the MRI apparatus requires a broader space into which the inspection object is inserted to prevent the inspection object from receiving a closed space feeling. An inspection side also requires a broader imaging region. On the other hand, it is required to make the magnets for generating a static magnetic field as small as a positional lamination in an installation chamber allows. In consideration of these things, it is required to thin the gradient magnetic field coil because the gradient magnetic field coil is disposed between the magnet for generating the static magnetic field and the imaging region. Accordingly, a thin copper plate may be frequently used as a conductor forming the gradient magnetic field coil. The copper plate is processed by etching or cutting to form a coil line having a spiral pattern necessary for generating the gradient magnetic field.

However, when a magnetic field generated by a pulse current having a large quantity, i.e., a large current having steep variations in waveform, is applied to the coil line of the thin copper plate, eddy current is generated in the coil line. This increases the temperature of the device. To suppress generation of the eddy current in the coil line, it is considered that the coil line is formed with a plurality of thin wires. However, such a configuration results in increase in resistance throughout the coil line. This increases a heat quantity due to a large quantity pulse current flowing through the coil line.

As mentioned above, a relation between the heat generation due to the eddy current and the heat generation due to the large quantity pulse current with a steep variation may be apparently considered to have a trade-off relation. However, if the heat generations can be suppressed within a usable range, such suppression is advantageous.

The present invention aims to provide a gradient magnetic field coil device capable of suppressing heat generation due to the eddy current and heat generation due to a large quantity of pulse current with steep variation within a usable range and provide a magnetic resonance imaging apparatus using the gradient magnetic field coil device.

To achieve the object, the present invention is characterized in that when a gradient magnetic field is generated, a low magnetic field region and a high magnetic field region are generated where a magnetic field crossing at least one of first and second forward coils and first and second reverse coils has different intensities between the low and high magnetic field regions and the intensity in the high magnetic region is higher than the intensity in the low magnetic field region. A line width of the coil line in the high magnetic field region is narrower than the line width of the coil line in the low magnetic field region.

Means for Solving Problem

In addition, the present invention is characterized in that the magnetic resonance imaging apparatus includes such a gradient magnetic field coil.

Advantageous Effect

According to the present invention, a gradient magnetic field coil device capable of suppressing heat generation due to the eddy current and heat generation due to a large quantity of pulse current with steep variation within a usable range and a magnetic resonance imaging apparatus using the gradient magnetic field coil device, are provided.

Figure 1:
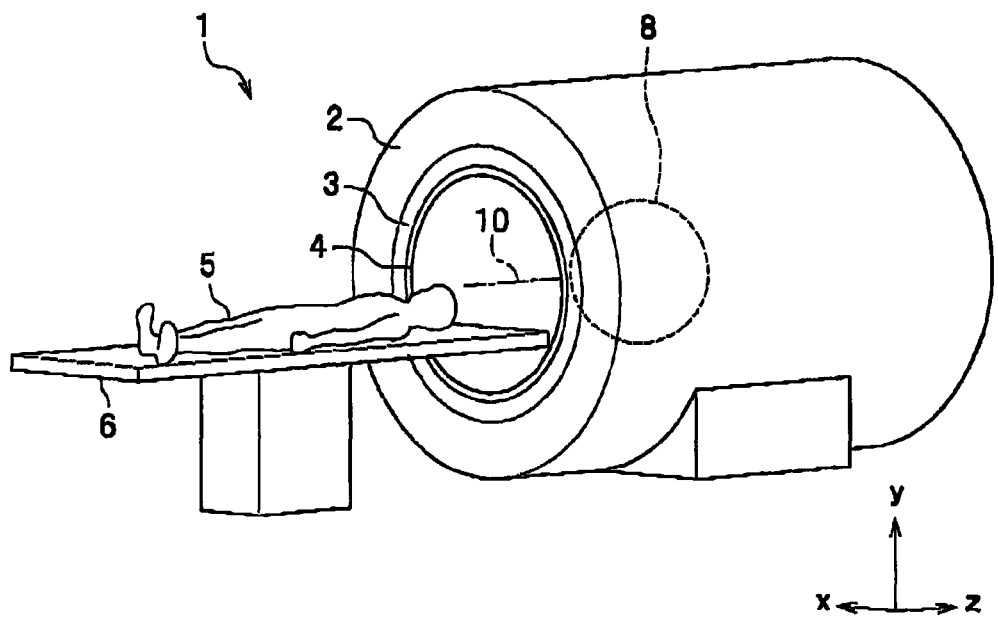
FIG. 1 is a perspective view of a magnetic resonance imaging apparatus according to a first embodiment of the present invention.

DESCRIPTION OF REFERENCE NUMERALS 1 magnetic resonance imaging (MRI) apparatus
2 static magnetic field coil device
2a static magnetic field main coil (superconducting coil)
2b static magnetic field shield coil (superconducting coil)
2c vacuum vessel
2d heat radiation shield
2e refrigerant vessel
3 gradient magnetic field coil device
4 RF coil
5 inspection object (patient)
6 bed
7 direction of static magnetic field
8 imaging region (center region)
9 gradient magnetic field
10 symmetric axis
11a first forward coil (gradient magnetic field main coil)
11b second forward coil (gradient magnetic field main coil)
11c first reverse coil (gradient magnetic field main coil)
11d second reverse coil (gradient magnetic field main coil)
12a, 12b, 12c, and 12c gradient magnetic field shield coil
13 gradient magnetic field coil layer
14 gradient magnetic field shield coil layer
16, 16a, 16b base member
17 example of current direction
18 magnetic field crossing gradient magnetic field main coil
19 magnetic flux line
20 center of spiral (turn) of gradient magnetic field main coil
21 high magnetic field region
22 low magnetic field region
23 connecting pillar
24 coil line

BEST MODE FOR CARRYING OUT THE INVENTION

With reference to the drawings will be described embodiments of the present invention. The same parts in respective drawings are designated with the same references, and thus, a duplicated explanation will be omitted.

First Embodiment

FIG. 1 is a perspective view of an MRI (magnetic resonance imaging) apparatus 1 according to a first embodiment of the present invention. The MRI apparatus 1 includes: a static magnetic field coil device 2 for generating a uniform static magnetic field in an imaging region 8 into which an inspection object 5 lying on a bed 6 is inserted; a gradient magnetic field coil device 3 for generating a pulsed gradient magnetic field of which magnetic intensity spatially varies to have a gradient to apply positional data in the imaging region 8; an RF coil 4 for irradiating high frequency pulses to the inspection object 5 inserted into the imaging region 8; a receiving coil (not shown) for receiving a magnetic resonance signal from the inspection object 5; and a computer system (not shown) for processing the received magnetic resonance signal to display a tomographic image of the inspection object 5. The static magnetic field coil device 2, the gradient magnetic field coil device 3, and the RF coil 4 have sleeve shapes having a common axis on a symmetric axis 10. An outer surface of the gradient magnetic field coil device 3 faces an inner surface of the static magnetic field coil device 2 and an outer surface of the RF coil 4 faces an inner surface of the gradient magnetic field coil device 3.

The imaging region 8 is provided at a space surrounded by an inner circumferential face of the RF coil 4 on a side of a symmetric axis 10. To prevent the inspection object 5 inserted into the imaging region from feeling a closed space sense and provide the image region 8 as wide as possible, an inner diameter of the RF coil 4 is required to be as large as possible and to make an installation area as small as possible, and an outer diameter of the static magnetic field coil device 2 is required to be as small as possible. Accordingly, the gradient magnetic field coil device 3 is designed to be made as thin as possible in addition to the static magnetic field coil device 2 and the RF coil 4. A z-axis is set in parallel to the symmetric axis 10, a y-axis is set in a vertical direction, and an x axis is set to be perpendicular to the z and y axes.

Figure 2:
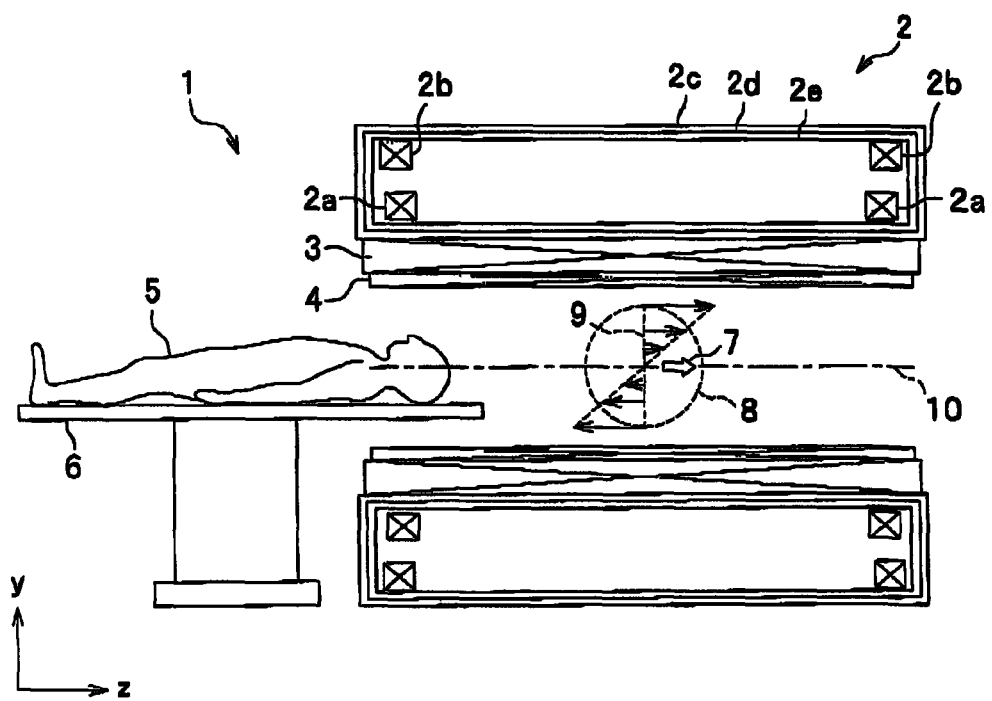
FIG. 2 is a cross section view, taken on a y-z plane including a symmetric axis (z axis), of the magnetic imaging apparatus according to the first embodiment of the present invention.

FIG. 2 shows a cross section view, taken on a y-z plane including the symmetric axis 10 (z axis), of the magnetic imaging apparatus 1 according to the first embodiment of the present invention. The static magnetic field coil device 2 includes the static magnetic field main coil 2a and a static magnetic field shield coil 2b, which are superconducting coils, to generate a uniform strong static magnetic field in the imaging region 8. A pair of the static magnetic field main coils 2a generate the uniform strong static magnetic field in the imaging region 8, and a pair of the static magnetic field shield coils 2b suppress a leak magnetic field caused by generating the static magnetic field 7 that leaks from the static magnetic field coil device 2 outwardly from the static magnetic field coil device 2. The pair of the static magnetic field main coils 2a and the pair of the static magnetic field shield coils 2b have torus shapes having the axis on the symmetric axis 10, respectively.

The pair of the static magnetic field main coils 2a and the pair of the static magnetic field shield coils 2b are housed in a vessel with a three layer configuration as shown in FIG. 2. First, a pair of the static magnetic field main coils 2a and a pair of the static magnetic field shield coils 2b are contained in a refrigerant vessel 2e together with liquid helium (He) of a refrigerant. The refrigerant vessel 2e is contained in a heat radiation shield 2d for stopping heat radiation into the refrigerant vessel 2e. A vacuum vessel 2c contains the refrigerant vessel 2e and the heat radiation shield 2d therein to hold the inside thereof in a vacuum state. Because the inside of the vacuum vessel 2c is evacuated, even if the vacuum vessel 2c is placed in a room with a normal temperature, heat in the room cannot be conducted to the refrigerant vessel 2e by transmission or convection. In addition, the heat radiation shield 2d prevents heat in the room from conducting by radiation from the vacuum vessel 2c to the refrigerant vessel 2e. Accordingly, the pair of the static magnetic field main coils 2a and the pair of the static magnetic field shield coils 2b can be set stably at a cryogenic temperature which is a temperature of the refrigerant to be operated as a superconductive magnet.

The gradient magnetic field coil device 3 generates a pulse gradient magnetic field 9 in any given direction, wherein a magnetic intensity of the pulse gradient magnetic field 9 in the same direction of the static magnetic field 7 is a gradient. Generally, it is assumed that a direction of the static magnetic field 7 is a z axis, and two directions perpendicular to the z axis are an x axis and the y axis. Then, the gradient magnetic field coil device 3 has a function of generating gradient magnetic fields 9 independently in three directions, i.e., an x-axis direction, a y-axis direction, and a z-axis direction, on the static magnetic field 7. In the first embodiment, as shown in FIG. 2, an example will be described where the gradient magnetic field 9 is a gradient in the y-direction for an easy explanation.

Figure 3:
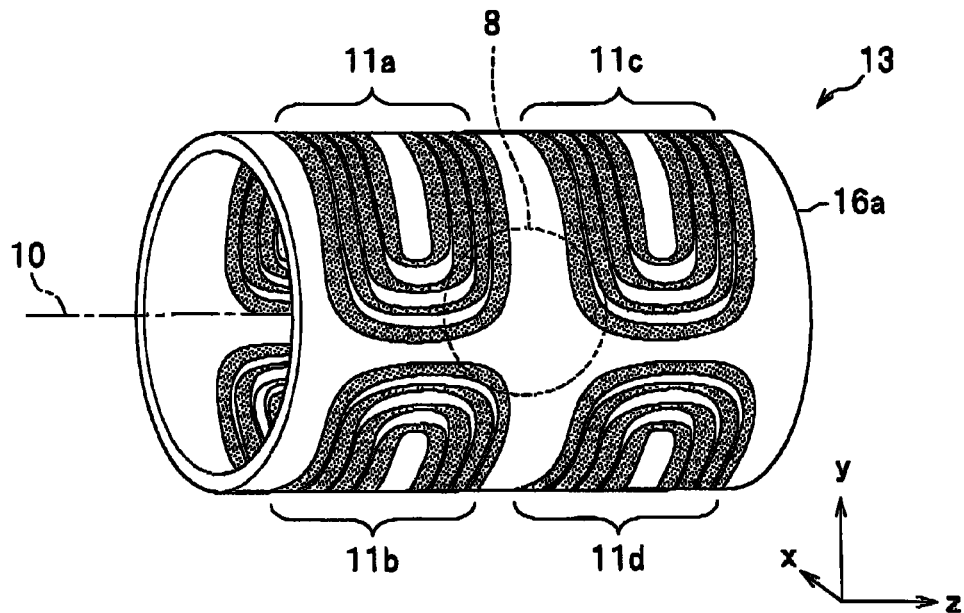
FIG. 3 is a perspective view of a y-axis gradient magnetic field main coil layer.

FIG. 3 is a perspective view of a y-axis gradient magnetic field main coil layer 13. The y-axis gradient magnetic field main coil layer 13 is installed in the gradient magnetic field coil device 3. The y-axis gradient magnetic field main coil layer 13 includes a first forward coil 11a formed spirally, a second forward coil 11b formed spirally, facing the first forward coil 11a such that a center region for the imaging region 8 and the symmetric axis 10 are sandwiched between the first and second forward coils 11a and 11b, a first reverse coil 11c, formed spirally, disposed on the side of the first forward coil 11a regarding the imaging region 8 (symmetric axis 10), and a second reverse coil 11d, formed spirally, facing the first reverse coil 11c such that the center region for the imaging region 8 is sandwiched between the first and second reverse coils 11c and 11d. The first forward coil 11a, the second forward coil 11b, the first reverse coil 11c, and the second reverse coil 11d are fixed on a sleeve base member 16a along a circumferential direction about the symmetric axis 10. The first forward coil 11a, the second forward coil 11b, the first reverse coil 11c, and the second reverse coil 11d are formed thin by being clipped from a conductive plate such as copper (Cu) and aluminum (Al) to have spiral coil lines. Etching, water jet, and punching are useable methods of clipping spiral wires.

In the first embodiment, as shown in FIG. 3, a width of coil lines or a distance between coil lines varies between the first forward coil 11a and the second forward coil 11b, and the first reverse coil 11c and the second reverse coil 11d.

The gradient magnetic field 9 of which magnetic field intensity is a gradient in the y-axis is generated in the imaging region 8 as shown in FIG. 2 by allowing a current to flow through the second forward coil 11b in a direction identical with a direction of a current flowing through the first forward coil 11a and a current to flow through the first reverse coil 11c and the second reverse coil 11d in an opposite direction to the current flowing through the first forward coil 11a. More specifically, the first forward coil 11a, the second forward coil 11b, the first reverse coil 11c, and the second reverse coil 11d function as a gradient magnetic field main coil.

Figure 4:
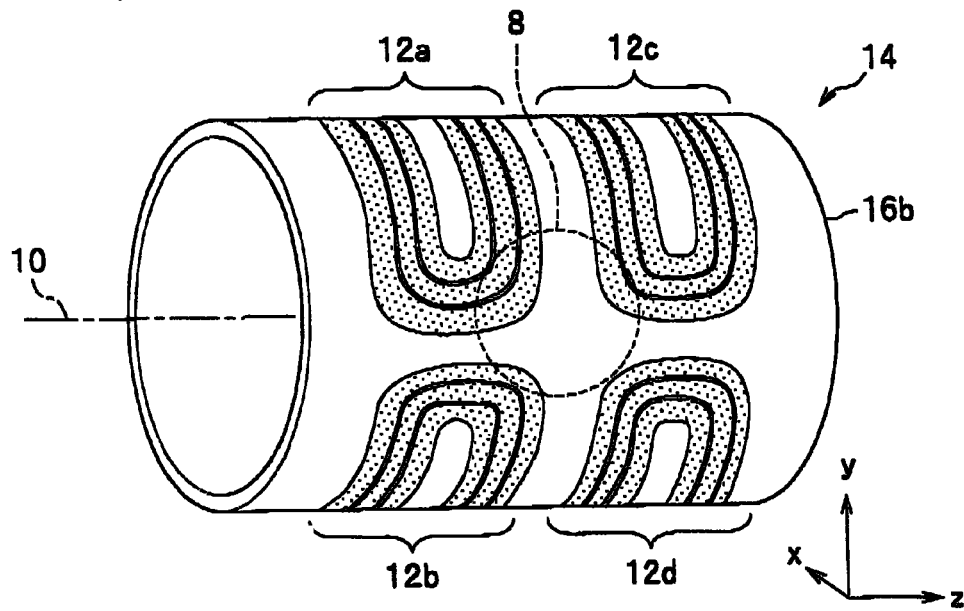
FIG. 4 is a perspective view of a y-axis gradient magnetic field shield coil layer.

FIG. 4 is a perspective view of a y-axis gradient magnetic field shield coil layer 14. The y-axis gradient magnetic field shield coil layer 14 is also disposed in the gradient magnetic field coil device 3 similarly to the y-axis gradient magnetic field main coil layer 13 shown in FIG. 3. The y-axis gradient magnetic field shield coil layer 14 includes a gradient magnetic field shield coil 12a formed spirally, a gradient magnetic field shield coil 12b formed spirally, facing the gradient magnetic field shield coil 12a such that the center region which becomes the imaging region 8 and the symmetric axis 10 are sandwiched between the gradient magnetic field shield coil 12a and the gradient magnetic field shield coil 12b, a gradient magnetic field shield coil 12c, formed spirally, disposed on the side of the gradient magnetic field shield coil 12a regarding the imaging region 8 (symmetric axis 10), and a gradient magnetic field shield coil 12d, formed spirally, facing the gradient magnetic field shield coil 12c such that the center region 8 is sandwiched between the gradient magnetic field shield coil 12c and the gradient magnetic field shield coil 12d. The gradient magnetic field shield coils 12a, 12b, 12c, and 12d are fixed on a sleeve base member 16b along a circumferential direction thereof about the symmetric axis 10. The gradient magnetic field shield coils 12a, 12b, 12c, and 12d are formed thin by being clipped from a conductive plate such as copper (Cu) and aluminum (Al) to have spiral coil lines. Etching, water jet, and punching are useable method of clipping spiral wires.

As shown in FIG. 4, the gradient magnetic field shield coil 12a, the gradient magnetic field shield coil 12b, the gradient magnetic field shield coil 12c, and the gradient magnetic field shield coil 12d each have a constant width of the coil line and a constant distance between the coil lines irrespective of regions in the coil. In addition, the gradient magnetic field shield coil 12a, the gradient magnetic field shield coil 12b, the gradient magnetic field shield coil 12c, and the gradient magnetic field shield coil 12d have a smaller turn number of wire than the first forward coil 11a, the second forward coil 11b, the first reverse coil 11c, and the second reverse coil 11d.

Figure 5:
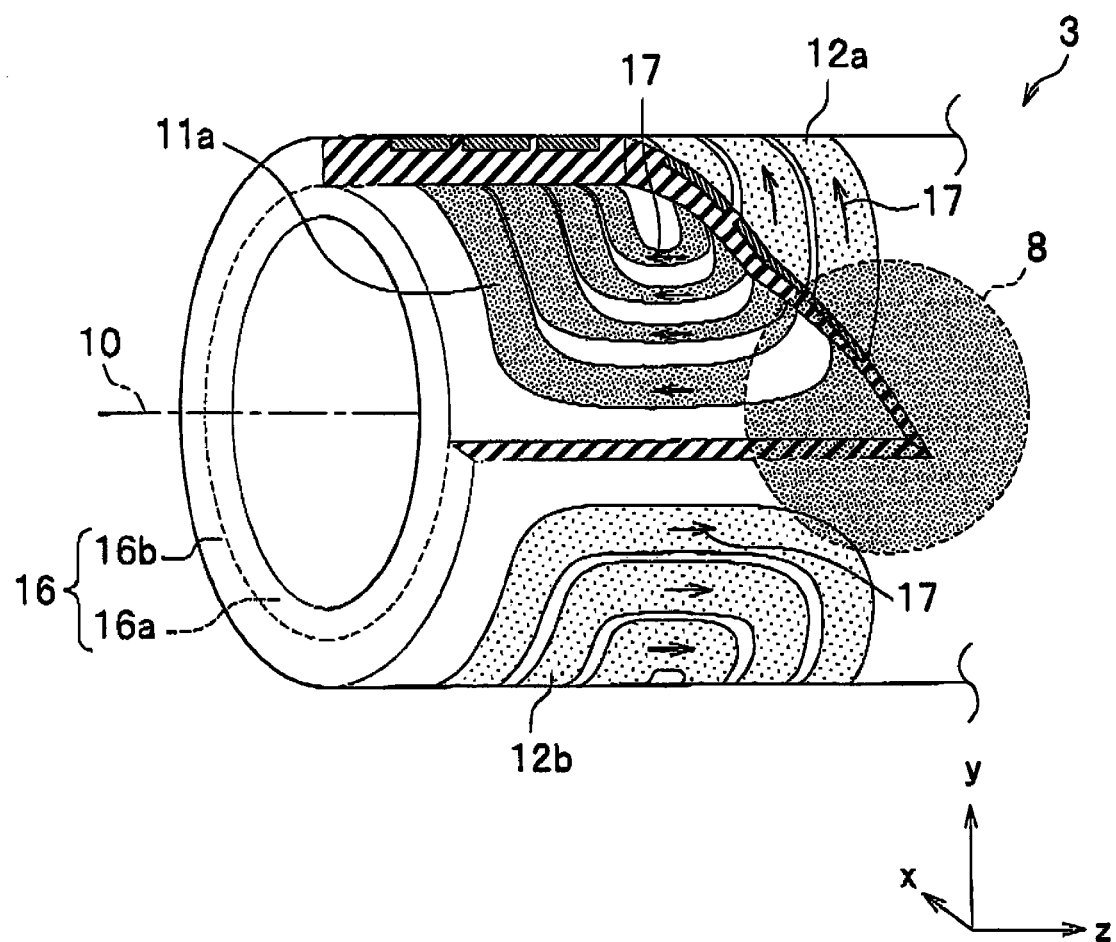
FIG. 5 is a perspective view of a gradient magnetic field coil device in which the y-axis gradient magnetic field main coil layer and the y-axis gradient magnetic field shield coil layer are laminated.

FIG. 5 shows a perspective view of a part of a gradient magnetic field coil device 3 in which a y-axis gradient magnetic field main coil layer 13 and a y-axis gradient magnetic field shield coil layer 14 are laminated. On an outer circumferential surface of the base member 16a, an inner circumferential surface of the base member 16b is disposed to form the base member 16 having a sleeve shape in which the base member 16a and the base member 16b are combined. An exterior of the gradient magnetic field shield coil 12a is greater than the first forward coil 11a. The gradient magnetic field shield coil 12a is disposed to cover the whole of the first forward coil 11a.

FIG. 5 shows directions 17 of currents flowing through the gradient magnetic field shield coil 12a and the first forward coil 11a. When a current having the same intensity as the current flowing through the first forward coil 11a in an opposite direction to the first forward coil 11a is allowed to flow, magnetic fields generated outside an outer circumferential face of the gradient magnetic field coil device 3 are cancelled in which the gradient magnetic field 9 is left in the imaging region because the number of turns of the gradient magnetic field shield coil 12a is smaller than that of the first forward coil 11a. The gradient magnetic field shield coil 12b is disposed so as to cover the second forward coil 11b similarly to how the gradient magnetic field shield coil 12a covers the first forward coil 11a (see FIG. 3). The gradient magnetic field shield coil 12c (see FIG. 4) is disposed so as to cover the first reverse coil 11c (see FIG. 3). The gradient magnetic field shield coil 12d (see FIG. 4) is disposed so as to cover the second reverse coil 11d (see FIG. 3).

Figure 6A:
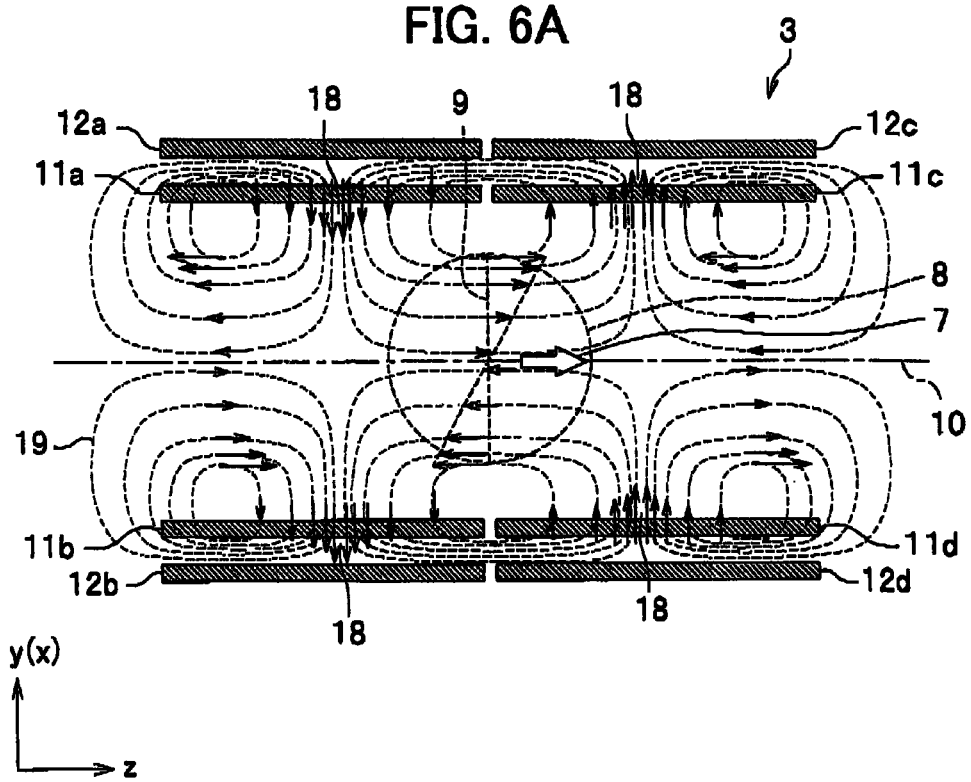
FIG. 6A shows a magnetic flux density distribution on a y-z plane including a symmetric axis (z axis)

FIG. 6A shows a magnetic flux density distribution in a y-z plane including a symmetric axis (z axis) 10 when the gradient magnetic field 9 is formed in the imaging region 8. When the gradient magnetic field 9 is formed in the imaging region 8, FIG. 6A shows that there are magnetic fields 18 crossing coils of the first forward coil 11a, the second forward coil 11b, the first revere coil 11c, and the second reverse coil 11d. Orthogonal components crossing the coils 11a to 11d of the magnetic field 18 vary with the large pulse current having a steep variation applied to the first forward coil 11a to the second reverse coil 11d. This may cause eddy currents to be easily generated in the first and second forward coils 11a and 11b and the first and second reverse coils 11c and 11d.

Figure 6B:
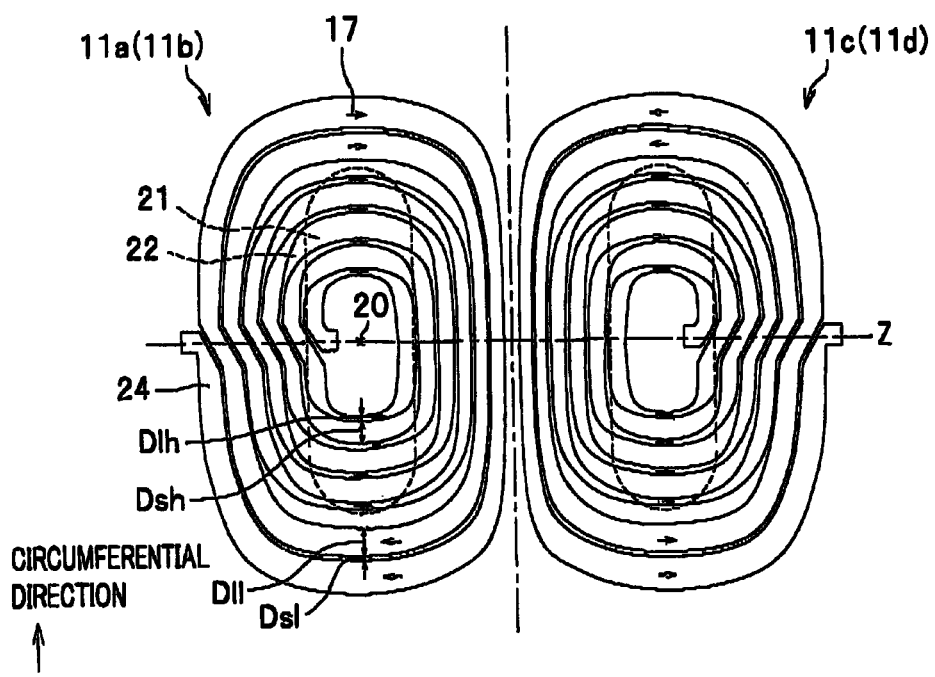
FIG. 6B is a development diagram of a first forward coil and a first reverse coil in the gradient magnetic field main coil developed in a circumferential direction.

The orthogonal components of the magnetic field 18 crossing the first and second forward coils 11a and 11b and the first and second reverse coils 11c and 11d have a distribution in intensity at each of coils 11a to 11d, and the closer to the center 20 the measurement location moves from a peripheral part of an exterior of each of the coils 11a to 11d the higher intensity the orthogonal components have. More specifically, FIG. 6B shows a development diagram of the coils 11a to 11d developed in a circumferential direction (note, when developed, the second reverse coil 11d has the same shape as the coil 11c). A high magnetic field region 21 surrounded by a broken line has higher intensity of the orthogonal components of the magnetic field 18 crossing the coil than a low magnetic field region 22 around the high magnetic field region 21. The high magnetic field region 21 locates at a center part of the exterior of each of the coils 11a to 11d regarding a width in the z-axis direction.

Because easiness in generation of the eddy current is in proportion to a time variation rate of the intensity of the orthogonal component of the magnetic field 18 crossing the coils 11a to 11d, when the magnetic field 18 crossing the coils 11a to 11d is switched on and off by the large pulse current, a rising time of a pulse is unchanged in any region within the coil. Accordingly, a magnitude of the time variation rate of the orthogonal component intensity of the magnetic field 18 crossing the coil is in proportion to the intensity of the orthogonal component of the magnetic field 18 crossing the coil. Therefore, it is considered that the eddy current is easily generated as a location goes from the peripheral part of the exteriors of the coils 11a to 11d to the center 20. More specifically, as shown in FIG. 6B, the eddy current is more easily generated at the high magnetic field region 21 surrounded by the broken line than the low magnetic field region 22 around the high magnetic field region 21.

Accordingly, as shown in FIG. 6B, a line width Dlh of the coil line 24 in the high magnetic field region 21 is made smaller than a line width Dll of the coil line 24. In addition, a gap Dsh between adjacent parts of the coil line 24 in the high magnetic field region 21 is made larger than a gap Dsl of adjacent parts of the coil lines 24 at the low magnetic field region 22. In addition, the line width Dlh of the coil line 24 in the high magnetic field region 21 is made narrower than the gap Dsh between the coil lines 24 in the high magnetic field region 21. On the other hand, the line width Dll of the coil line 24 in the low magnetic field region 22 is made wider than the gap Dsl between adjacent parts of the coil line 24 in the low magnetic field region 22. These configurations can make the space where the eddy currents are generated small, which makes generation of the eddy current difficult. Because in the low magnetic field region 22, the eddy current cannot be easily generated, as a whole of the coil, it is made difficult to generate the eddy current. On the other hand, because the coil line 24 in the low magnetic field region 22 can be made to have a low resistance, an increase tendency of the resistance of the whole of the coil line 24 is suppressed, which suppresses the heat generation due to the large pulse current flowing through the coil line 24.

The line width Dlh of the coil line 24 in the high magnetic field region 21 to be narrowed is determined by a magnetic flux density of the gradient magnetic field orthogonal thereto, a frequency of AC components of the large pulse current, and a thickness of the conductive plate for the coil line 24. For example, it is proper to set the line width Dlh equal to or smaller than 10 mm when the gradient magnetic field crossing the coil line 24 is equal to or greater than 30 mT, the frequency is 500 Hz, and the thickness of the conductive plate is 5 mm.

The high magnetic field region 21 is determined such that at least a turn out of a plurality of the spiral turns of the coils 11a to 11d should be disposed from a side of the center 20, and that the number of turns from the center 20 of the spiral are determined as the high magnetic field region 21 in accordance with an intensity of the pulse current flowing through the coil line 24.

On the other hand, as shown in FIG. 6A, there is no magnetic field crossing the gradient shield coils 12a to 12d. This indicates that a magnetic field to be generated outside the outer surfaces of the gradient magnetic field shield coils 12a to 12d is cancelled. Because no magnetic field crosses the gradient magnetic field shield coils 12a to 12d, no eddy current is generated in the gradient magnetic field shield coils 12a to 12d.

The coils 11a to 11d are disposed relative to the imaging region 8 so that a z-axis coordinate of an end of the imaging region 8 in the z-axis may be disposed in the vicinity of z-axis coordinates of the center 20 of the spirals of the coils 11a to 11d.

Figure 7:
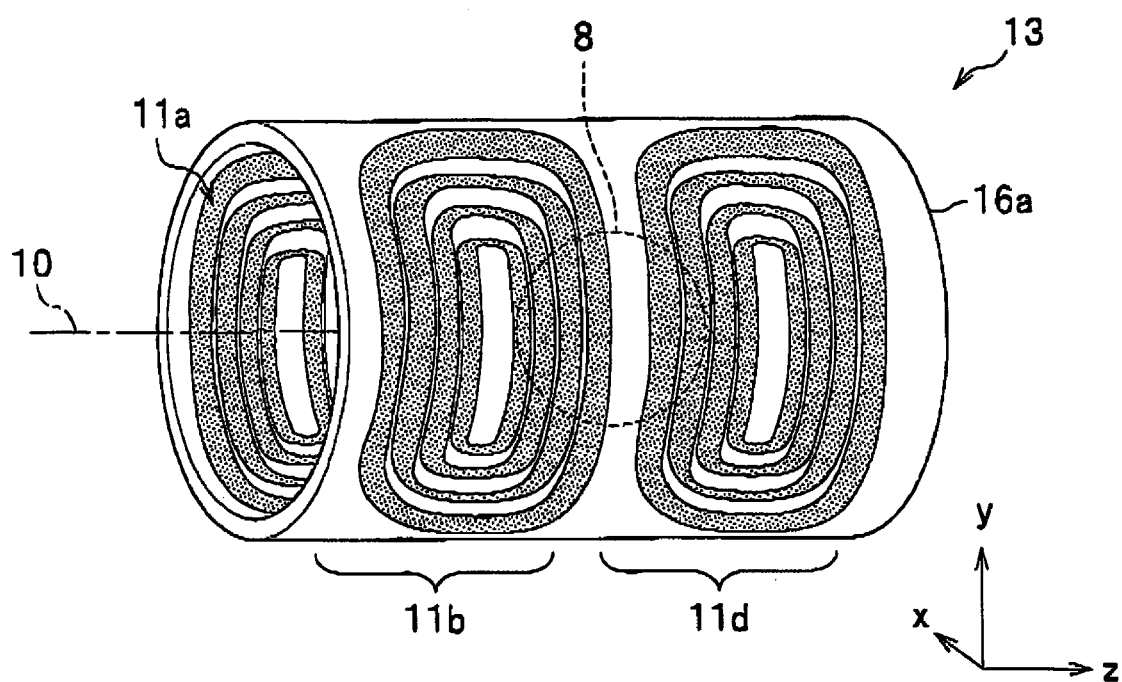
FIG. 7 is a perspective view of an x-axis gradient magnetic field main coil layer.

FIG. 7 shows a perspective view of an x-axis gradient magnetic field main coil layer 13. The x-axis gradient magnetic field layer 13 can generate a gradient magnetic field of which magnetic intensity in the x-axis is a gradient in the imaging region 8. The x-axis gradient magnetic field main coil layer 13 shown in FIG. 7 has such a configuration as to be turned by 90 degrees about the symmetric axis 10 as a rotation axis relative to the y-axis gradient magnetic field main coil layer 13 shown in FIG. 3 to cover the y-axis gradient magnetic field main coil layer 13 with increase or decrease in size in a radial direction. Similarly, the gradient magnetic coil device 3 has an x-axis magnetic field shield coil layer having such a configuration that the y-axis gradient magnetic field shield coil layer 14 is turned by 90 degrees and a size is increased or decreased. These x-axis gradient magnetic field main coil layer 13 and the x-axis gradient magnetic field shield coil layer also provide the magnetic flux lines 19 and magnetic flux density distribution shown in FIG. 6A in which the y-axis is rewritten as the x-axis. This configuration provides the same effect by the y-axis gradient magnetic field main coil layer 13 and the y-axis gradient magnetic field shield coil layer 14. The gradient magnetic coil device 3 has a z-axis gradient main coil layer and a z-axis gradient magnetic field shield coil layer for generating the gradient magnetic field of which magnetic intensity is a gradient in the z-axis in the imaging region 8. However, a detailed description will be omitted.

Second Embodiment

Figure 8:
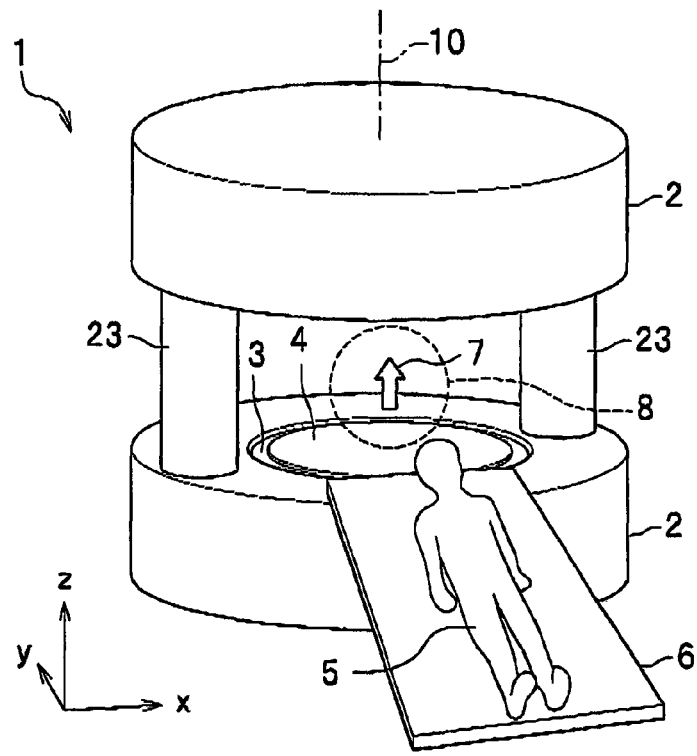
FIG. 8 is a perspective view of a magnetic resonance imaging apparatus according to a second embodiment of the present invention.

FIG. 8 shows a perspective view of an MRI apparatus 1 according to a second embodiment of the present invention. As shown in FIG. 2, the MRI apparatus 1 according to the first embodiment is of a horizontal magnetic field type MRI 1 in which a direction of the static magnetic field 7 is horizontal. On the other hand, the MRI apparatus according to the second embodiment is of a vertical magnetic field type MRI in which a direction of the static magnetic field 7 is vertical.

The MRI apparatus 1 includes a pair of upper and lower static magnetic field coil devices 2 for generating a uniform static magnetic field 7 in the imaging region 8, in which the pair of the static magnetic field coil devices 2 are disposed to sandwich the imaging region 8 into which the inspection object 5 lying on the bed 6 is inserted; connecting pillars 23 for supporting the upper and lower static magnetic field coil devices 2 spaced; the gradient magnetic field coil device 3 for generating a pulse gradient magnetic field of which magnetic field intensity is spatially a gradient; an RF coil 4 for irradiating a high frequency pulses to the inspection object 5 inserted into the imaging region 8, a receiving coil (not shown) for receiving a reception signal; and a computer system (not shown) for displaying a tomographic image of the inspection object 5 through processing the received magnetic resonance signal. The pair of upper and lower static magnetic field coil devices 2, the gradient magnetic field coil device 3, and the RF coil 4 have circular disc shapes (cylindrical shapes) having a common axis on the symmetric axis 10. The inspection object 5 is carried to the imaging region 8 by a movable bed 6 in which a closed space feeling can be reduced because the inspection object 5 can see therearound because there are only two thin connecting pillars 23 that connect the pair of upper and lower static magnetic field coil devices 2. A z-axis is set in a vertical direction which is in parallel to the symmetric axis 10, and an x-axis and y-axis are set in horizontal directions and perpendicular to each other.

Figure 9:
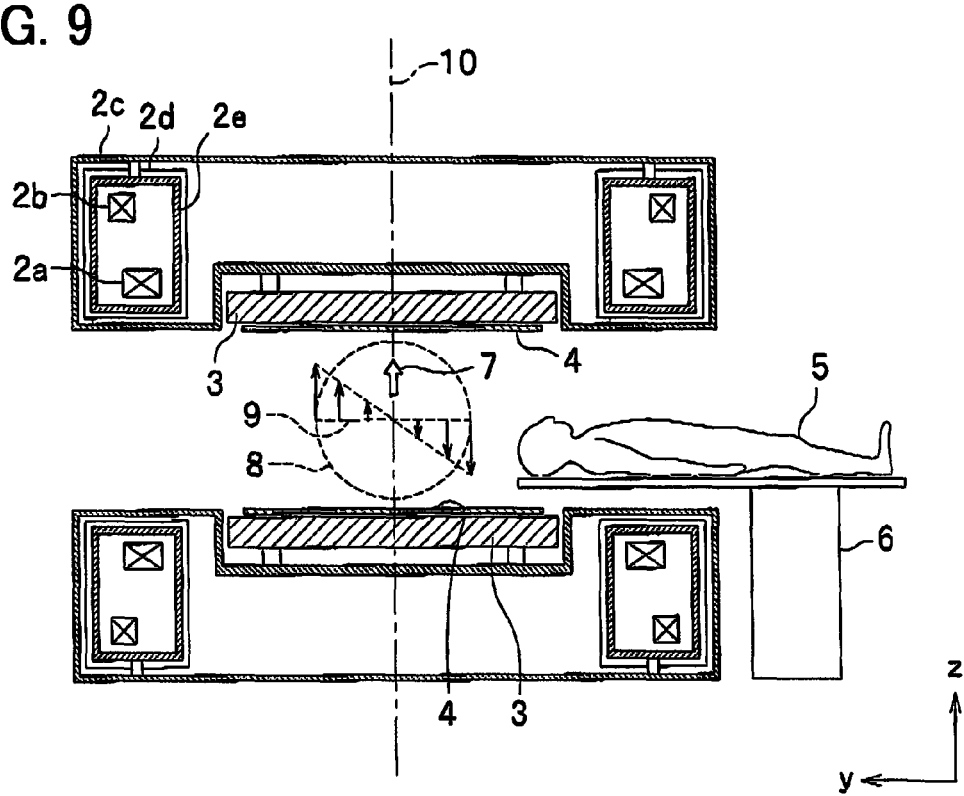
FIG. 9 is a cross section view, taken on a y-z plane including the symmetric axis (z axis) of the magnetic resonance imaging apparatus according to a second embodiment of the present invention.

FIG. 9 shows a cross section view, taken on a y-z plane including the symmetric axis 10 (z axis), of the magnetic resonance imaging apparatus according to the second embodiment of the present invention. In the pair of upper and lower static magnetic field coil devices 2, a pair of upper and lower static magnetic field main coils 2a and a pair of upper and lower static magnetic field shield coils 2b are used. The pair of the upper and lower static magnetic field main coil 2a and the pair of the upper and lower static magnetic field shield coils 2b have torus shapes having an axis on the symmetric axis 10. The pair of upper and lower static magnetic field main coils 2a and the pair of upper and lower static magnetic field shield coils 2b are contained by vessels with three layer structure including a refrigerant vessel 2e, a heat radiation shield 2d and a vacuum vessel 2c similarly to the first embodiment.

The MRI apparatus 1 further includes a pair of upper and lower gradient magnetic field devices 3 disposed vertically so as to sandwich the imaging region 8. The MRI apparatus 1 further includes a pair of upper and lower RF coils 4 disposed to sandwich the imaging region 8. The pair of the upper and lower gradient magnetic field coil devices 3 generate the pulse gradient magnetic field 9 of which magnetic field intensity varies to have a gradient in the same direction of the static magnetic field 7 in any given direction. Generally, it is assumed that a direction of the static magnetic field 7 is the z axis, and the x-axis and the y-axis are set in two directions orthogonal to the z-axis, and the gradient magnetic field coil device 3 has a function to generate gradient magnetic fields independently in three directions of x-, y-, and z-axes with superimposing. In the second embodiment, as shown in FIG. 9, the gradient magnetic field 9 having a gradient in the y-axis is exemplified for an easy explanation.

Figure 10A:
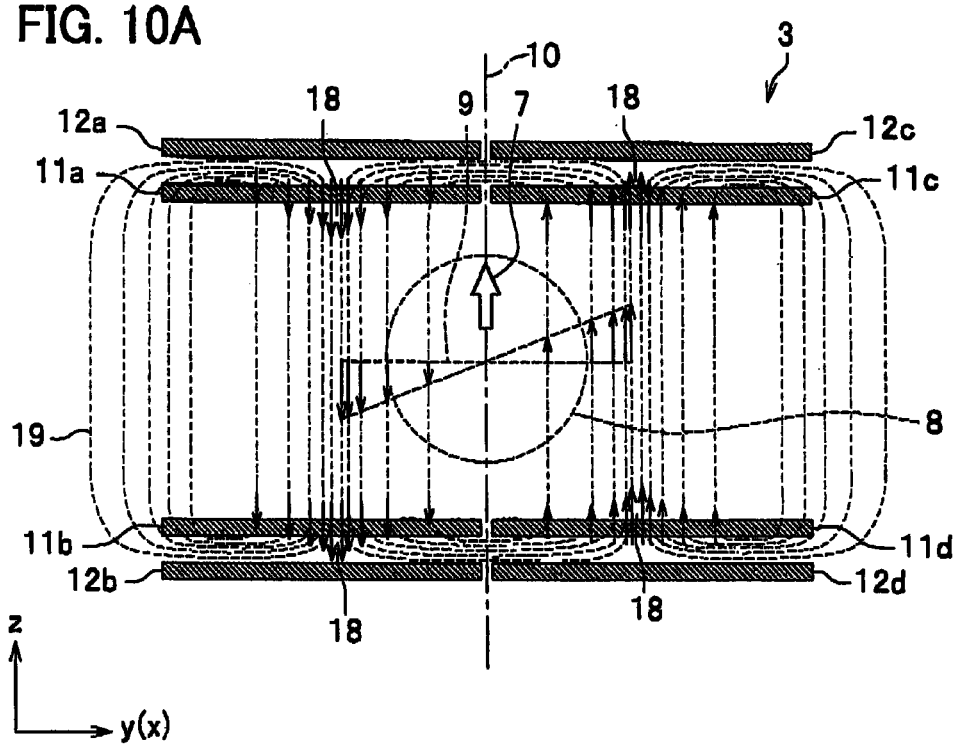
FIG. 10A shows a magnetic flux density distribution on the y-z plane including the symmetric axis (z axis)
Figure 10B:
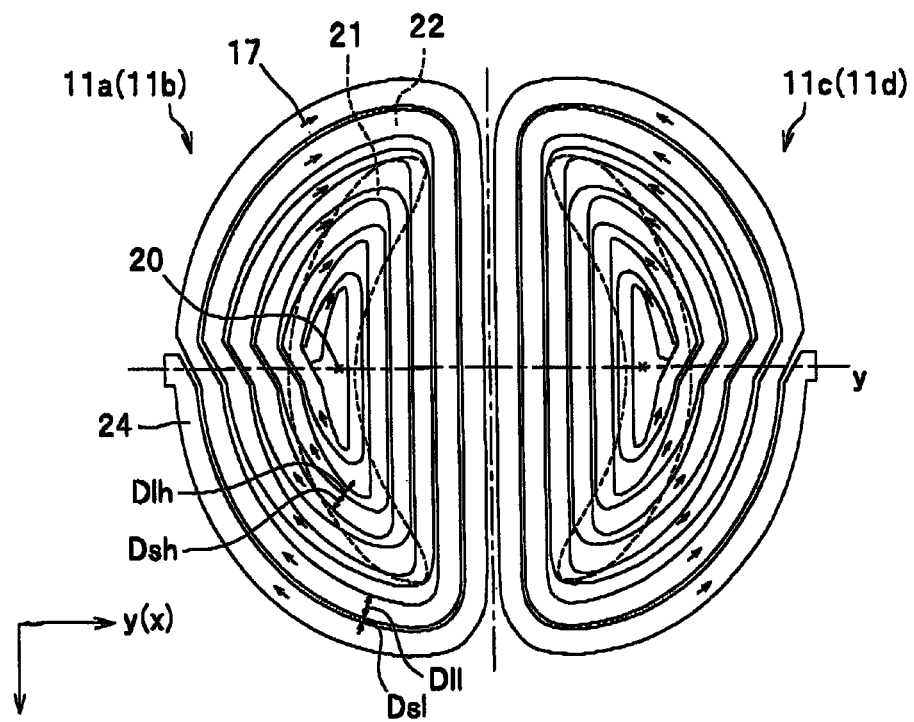
FIG. 10B is a plan view of the first forward coil and the first reverse coil of the gradient magnetic field main coil.

FIG. 10A shows the magnetic flux line 19 and a magnetic flux density distribution on the y-z plane including the symmetric axis 10 (z axis) when the gradient magnetic field 9 having a gradient in the y-axis is generated. In the pair of upper and lower gradient magnetic field coil devices 3, the first forward coil 11a, the first reverse coil 11c, gradient shield coils 12a and 12c are disposed on the upper side, and the second forward coil 11b, the second reverse coil 11d, gradient shield coils 12b and 12d are disposed on the lower side. The coils 11a to 11d in the second embodiment are different from the coils 11a to 11d in the first embodiment such that the coils 11a to 11d in the first embodiment are disposed on a curved surface on a sleeve, but on the other hand, the coils 11a to 11d in the second embodiment are disposed on planes. FIG. 10B shows a plan view of the first forward coil 11a and the first reverse coil 11c which are gradient magnetic field main coils. There is a different point in that the first forward coil 11a and the first reverse coil 11c have semicircle outer shapes. The outer shapes of the first forward coil 11a and the first reverse coil 11c combined are substantially a circle. The second forward coil 11b and the second reverse coil 11d are congruent with the first forward coil 11a and the first reverse coil 11c. There is a different point in that the gradient magnet field coils 12a to 12d in the second embodiment are disposed on planes differently from the gradient magnet field coils 12a to 12d in the first embodiment.

Allowing a current to flow through the second forward coil 11b in the same direction as the current flowing through the first forward coil 11a and allowing a current to flow through the first and second reverse coils 11c and 11d in the opposite direction as the current flowing through the first forward coil 11a generates a gradient magnetic field 9, which magnetic field has a gradient in the z-axis in the imaging region 8.

Then, as shown in FIG. 10B, the line width Dlh of the coil line 24 in the high magnetic field region 21 where orthogonal components of the magnetic field 18 crossing the coils having a higher intensity is narrower than the line width Dll of the coil line 24 in the lower magnetic field region 22 where the orthogonal components of the magnetic field crossing the coils have a lower intensity. The high magnetic field region 21 locates at a center of a width of the coils 11a to 11d in the y-axis direction and has a shape of parentheses "( )". A gap Dsh between adjacent parts of the coil lines 24 in the high magnetic field region 21 is made wider than the gap Dsl between adjacent parts of the coil line 24 in the low magnetic field region 22. In addition, the line width Dlh of the coil line 24 in the high magnetic field region 21 is made narrower than the gap Dsh between adjacent parts of the coil line 24 in the high magnetic field region 21. On the other hand, the line width Dll in the low magnetic field region 22 is made wider than the gap Dsl between adjacent parts of the coil lines 24 in the low magnetic region 22. These configurations can make spaces small where eddy currents are generated, thereby suppressing generation of the eddy currents in the high magnetic field region 21 where eddy currents are easily generated. Because the eddy current is not generated easily in the low magnetic field area 22, the eddy current is not able to be easily generated in the entire coil. On the other hand, the coil line 24 in the low magnetic field region 22 can be made low in resistance, which suppresses high resistance in the whole of the coil line 24. This suppresses heat generation due to the large pulse current that flows through the coil line 24.

In the second embodiment, as shown in FIG. 10A, the gradient magnetic field 9 has the gradient of the magnetic field in the y-axis direction. A gradient magnetic field 9 having a gradient of the magnetic field in the x-axis direction can be provided by disposing the coils 11a to 11d such that the x-axis coordinates and the y-axis coordinates in FIG. 10B are interchanged. This provides such magnetic flux lines 19 and a magnetic field density distribution that y-axis coordinates of the magnetic flux lines 19 and the magnetic field density distribution in FIG. 10A are replaced with the same x-axis coordinates, so that regarding suppression of the eddy current generation, the same effect can be provided as that in the case of the gradient magnetic field 9 having a gradient in the y-axis direction.

The invention claimed is:

1. A gradient magnetic field coil device comprising:
a first forward coil having a spiral shape;
a second forward coil, having a spiral shape, facing the first forward spiral coil through a center region;
a first reverse coil, having a spiral shape, disposed on a side of the first forward coil of the center region; and
a second reverse coil, having a spiral shape, facing the first forward spiral coil through the center region,
wherein a current flows through the second forward spiral coil in a same direction as a current flowing through the first forward spiral coil, and currents flow through the first and second reverse spiral coils in an opposite direction to the current flowing through the first forward coil to generate a gradient magnetic field in the center region,
wherein, when the gradient magnetic field is generated, a low magnetic field region and a high magnetic field region are generated where a magnetic field crossing at least one of the first and second forward coils and first and second reverse coils has different intensities between the low and high magnetic field regions and the intensity in the high magnetic field region is higher than the intensity in the low magnetic field region, and a line width of a coil line of at least one of the first forward coil, second forward coil, first reverse coil and second reverse coil in the high magnetic field is narrower than a line width of the coil line in the low magnetic field region, and
wherein the line width of the coil lines in the low magnetic field region is wider than the gap between adjacent parts of the coil line in the low magnetic field region.

2. The gradient magnetic field coil device as claimed in claim 1, wherein a gap between adjacent parts of the coil line in the high magnetic field region is wider than a gap between adjacent parts of the coil line in the low magnetic field region.

3. The gradient magnetic field coil device as claimed in claim 1, wherein the line width of the coil line in the high magnetic field region is narrower than the gap between adjacent parts of the coil line in the high magnetic field region.

4. The gradient magnetic field coil device as claimed in claim 1, wherein the high magnetic field region corresponds to a region where at least a turn of a plurality of spiral turns of one of the first and second forward and first and second reverse coils is disposed from a side of a center of a respective spiral shape of the one of the first and second forward and first and second reverse coils.

5. A magnetic resonance imaging apparatus comprising the gradient magnetic field coil device as claimed in claim 1, further comprising a static magnetic field coil device configured to generate a static magnetic field superimposed on the gradient magnetic field in the center region.

6. The gradient magnetic field coil device as claimed in claim 1, wherein the high magnetic field region is located at a central part of each of the first and second forward coils and the first and second reverse coils with respect to a width along a z-axis, where the z-axis is set in parallel to a length of the gradient magnetic field coil device.

7. The gradient magnetic field coil device as claimed in claim 1, wherein the high magnetic field region is located at a central part of each of the first and second forward coils and the first and second reverse coils with respect to a width along a y-axis, where the y-axis is set perpendicular to the z-axis and the z-axis is set in parallel to a length of the gradient magnetic field coil device and wherein the high magnetic field region has a parentheses shape.

8. The gradient magnetic field coil device as claimed in claim 1, further comprising:
a plurality of shield coils where a line width and a gap between coil lines of each of the shield coils is substantially constant.

9. The gradient magnetic field coil device as claimed in claim 1, wherein the line width of the coil line of each of the first forward coil, second forward coil, first reverse coil and second reverse coil in the high magnetic field region is narrower than the line width of the coil line in the low magnetic field region.

* * * * *